United States Patent [19]

Wincn

[11] Patent Number: 4,635,038

[45] Date of Patent: Jan. 6, 1987

[54] CMOS-TRANSISTOR-BASED DIGITAL-TO-ANALOG CONVERTER

[75] Inventor: John M. Wincn, Cupertino, Calif.

[73] Assignee: Advanced Micro Devices, Inc., Sunnyvale, Calif.

[21] Appl. No.: 796,668

[22] Filed: Nov. 8, 1985

[51] Int. Cl.$^4$ ............................................. H03M 1/78
[52] U.S. Cl. ............................................. 340/347 DA
[58] Field of Search .................. 340/347 DA, 347 AD

[56] References Cited

U.S. PATENT DOCUMENTS 4,336,527  6/1982  Von Sichart ................. 340/347 DA
4,415,883  11/1983  Von Sichart ................. 340/347 DA Primary Examiner—Charles D. Miller
Attorney, Agent, or Firm—Patrick T. King; Davis Chin

[57] ABSTRACT

A digital-to-analog converter for converting a digital signal having a plurality of binary bits into an analog output signal includes an R-2R ladder network forming a plurality of switching cells corresponding in number to the number of the binary bits. Each switching cell is formed of first, second and third pairs of CMOS transistors defining cross resistances of the ladder network and of a fourth pair of CMOS transistors defining a series resistance of ladder network. A pair of differential circuits drives each switching cell to control switching symmetry and conversion speed.

20 Claims, 3 Drawing Figures

CMOS-TRANSISTOR-BASED DIGITAL-TO-ANALOG CONVERTER

BACKGROUND OF THE INVENTION

This invention relates generally to digital-to-analog converters having an R-2R ladder network and more particularly, it relates to a digital-to-analog converter which employs an R-2R ladder network composed entirely of complementary metal-oxide-semiconductor (CMOS) transistors, For use with digital-to-analog converters, R-2R ladder networks are generally known which are composed of equal-valued resistors R arranged in a uniform ladder array. Each section of the ladder array has a leg or rung of two "R" elements connected in series, and the connection between each ladder section has a single "R" element connected in series to the next ladder section. Another single "R" element is also connected between the last single "R" element and a ground potential so as to complete the ladder array. This type of arrangement provides for equal parallel "R" impedance at each node of the ladder array when going from the most significant bit (MSB) to the least significant bit (LSB). Thus, if the resistive elements are of a uniform resistance value a reference current applied to the input at the MSB end will divide equally at each ladder node so that the output current for each successive 2R ladder rung, and thus each bit will be one-half of the output current of the previous bit down to the LSB. The uniform resistance value and node current division thus implies that the voltage drop on each "R" element of the ladder array must decrease by one-half as well for each succeeding ladder section. Such a conventional arrangement is shown in FIG. 1 of the drawings.

In U.S. Pat. No. 4,336,527 to von Sichart et, al., there is disclosed a digital-to-analog converter utilizing an R-2R ladder network wherein all of the R elements of the networks are implemented by MOS transistors of a single polarity, i.e. either N-channel or P-channel, biased in the "triode" operating region. A major problem associated with the sole use of single-polarity MOS transistors is the non-linearity error induced by other coefficients of resistance of the MOS "R" elements when converting a digital input signal into an analog output signal. This is because the drain-to-source resistance of each element of the MOS R-2R ladder array is completely determined by each respective drain-to-source voltage, gate-to-source voltage, and source-to-substrate voltage. Since the voltage drop on each "R" element of such a ladder network changes from the MSB end to the LSB end, the resistance values of the individual MOS transistors will deviate from a theoretically uniform resistance value of R. Another problem encountered with the R-2R structure formed of single-polarity MOS transistors is that the non-linearity error induced by the voltage coefficient of resistance will change as the reference current is switched from positive to negative, causing full-scale symmetry error.

Another problem encountered with the R-2R circuit described by the von Sichart et. al. reference is that the use of asymmetrical drivers for each R-2R switching cell will induce a long settling time at the digital-to-analog output by permitting the output and ground switches of each cell to be momentarily and simultaneously off for the input logic transition of "0" to "1", and momentarily and simultaneously on for the input logic transition of "1" to "0". This momentary condition will cause current throughout the ladder array to divide unequally at every ladder node until such switching transition is completed and proper ladder node current can be re-established. Consequently, the digital-to-analog converter of the type shown in the von Sichart et. al. patent will exhibit voltage coefficient of resistance and switching asymmetry, thereby adversely affecting digital-to-analog conversions, accuracy and linearity.

SUMMARY OF THE INVENTION

Accordingly, it is a general object of the present invention to provide an improved digital-to-analog converter with superior operating characteristics, particularly high-speed conversion capability together with high linearity performance, which is relatively simple and economical to manufacture and assemble, but yet overcomes the disadvantages of the prior art converters.

It is an object of the present invention to provide a digital-to-analog converter which employs an R-2R ladder network composed entirely of CMOS transistors.

It is another object of the present invention to provide an digital-to-analog converter which includes a plurality of switching cells with each cell being formed of first, second, third and fourth pairs of CMOS transistors.

It is still another object of the present invention to provide a digital-to-analog converter which includes first and second differential driver circuits for selectively turning on and off pairs of CMOS transistors in a switching cell, symmetrically.

It is still another object of the present invention to provide a digital-to-analog converter which includes a bias generator network for supplying a first bias voltage to a first differential driver circuit and a second bias voltage to a second differential driver circuit.

In accordance with these aims and objectives, the present invention is concerned with the provisions of a digital-to-analog converter for converting a digital signal having a plurality of binary bits into an analog output signal which includes an R-2R ladder network forming a plurality of switching cells corresponding in number to the number of the binary bits. Each switching cell is formed of first, second and third pairs of CMOS transistors defining cross resistances of the ladder network and of a fourth pair of CMOS transistors defining a series resistance of the ladder network. Each of the first through fourth pairs includes a P-channel MOS transistor and an N-channel MOS transistor having the drain of NMOS transistor connected to the source of PMOS transistor, and source of NMOS transistor connected to the drain of the PMOS transistor. The NMOS drain and PMOS source of the first pair is connected to the NMOS drain and PMOS source of the fourth pair to define a ladder node. The NMOS source and PMOS drain of the first pair is connected to the NMOS drain and PMOS source of the second pair and to the NMOS drain ad PMOS source of the third pair. The NMOS source and PMOS drain of the second pair is coupled to a common ground line, and the NMOS source and PMOS drain of the third pair is coupled to an output current summing line. The NMOS source and PMOS drain of the fourth pair is connected to a next ladder node of a succeeding switching cell. The gates of the P-channel MOS transistors in the first and fourth pairs are connected to a first supply voltage for rendering them to be constantly conductive and the gates of the N-channel MOS transistors in the first and second pairs are connected to a second supply voltage for rendering them to be constantly conductive. Differential driver circuits have inputs responsive to a respective binary bit of the digital signal and have outputs connected to the gates of the P-channel and N-channel transistors in the second and third pairs for selectively turning on or off the second pair and turning off or on the third pair respectively dependent upon the logic state of the respective binary bit.

BRIEF DESCRIPTION OF THE DRAWINGS

These and other objects and advantages of the present invention will become more fully apparent from the following detailed description when read in conjunction with the accompanying drawings with like references numerals indicating corresponding parts throughout wherein.

DESCRIPTION OF THE PREFERRED EMBODIMENT

Figure 1:
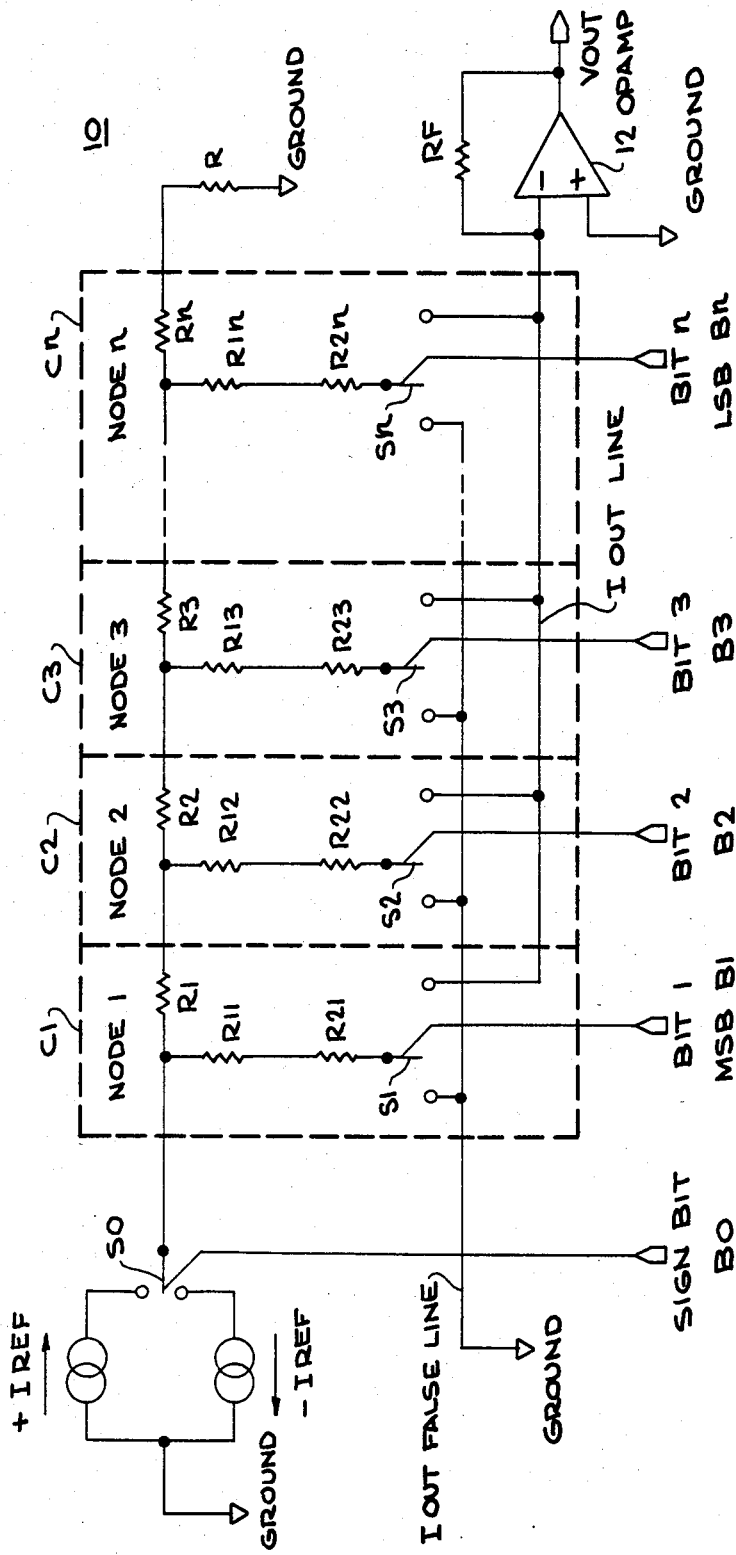
FIG. 1 is a schematic representation of a conventional digital-to-analog converter having an R-2R ladder array.

Referring now in detail to the various drawings, there is shown in FIG. 1 a schematic repesentation of a conventional digital-to-analog converter 10 having an R-2R ladder network or array which forms n identical switching cells C1, C2, ... Cn. Each switching cell is formed of a leg or rung of two "R" elements connected in series, and a single "R" element connected between the leg and the next switching cell. For example, the first cell C1 representing the most significant bit (MSB) consists of resistors R11, R21, and R1. The resistor R11 is connected in series at its one end with the resistor R21. The other end of the resistor R11 is connected to one end of the resistor R1 at ladder node 1. The other end of the resistor R1 is connected to the next cell C2 consisting of resistors R12, R22, and R2. The last cell Cn representing the least significant bit (LSB) is formed of resistors R1n, R2n and Rn. A single resistor R is also connected between the output of the last cell at point X and a common ground potential so as to complete the ladder network.

A reference current source is applied to the input of the ladder network at the MSB end with either a positive current +REF or a negative current −IREF dependent upon the position of a switch SO. The switch SO is controlled by a sign bit BO, i.e., a binary bit indicating whether the digital input signal to be converted is positive or negative. The other end of the resistors R21, R22, ... R2n in the respective cells C1, C2, ... Cn are connected to respective cell switches S1, S2, ... Sn. The cell switches S1, S2, ... Sn are controlled by the binary bits B1, B2, ... Bn of the digital signal to be converted. Each switching cell C1, C2, ... Cn is operated to switch current flowing through its respective leg between an output current summing line IOUT and a ground line IOUT FALSE. The summing line IOUT is connected in parallel with all of the switching cells C1,C2, ... Cn and is applied to the inverting input of an operational amplifier 12. The non-inverting input of the operational amplifier 12 is connected to the ground potential. The output VOUT of the amplifier 12 provides the analog output of the digital-to-analog converter.

Figure 2:
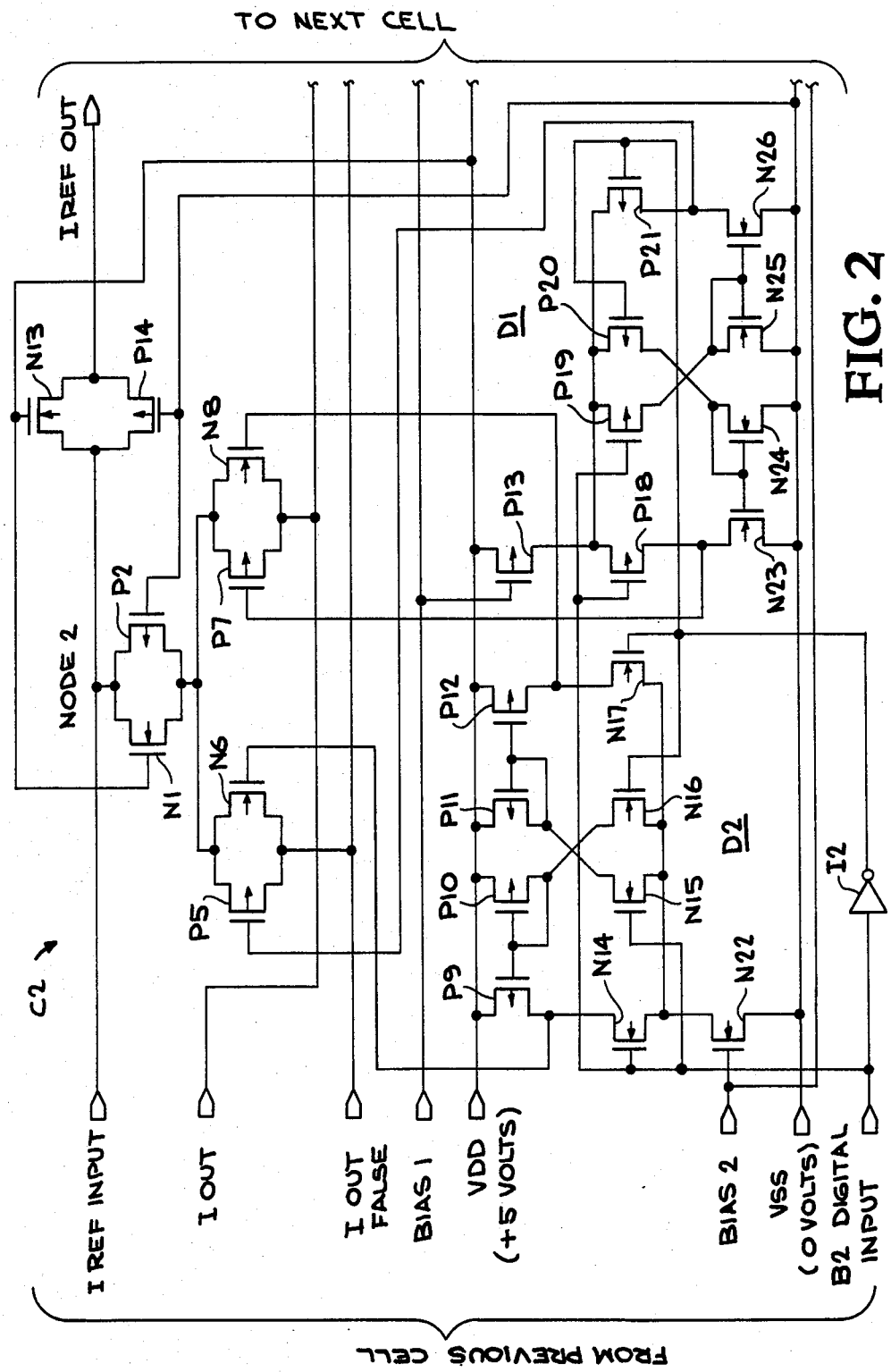
FIG. 2 is a schematic circuit diagram showing the details of one switching cell of a digital-to-analog converter of the present invention.

The present invention is concerned with the provision of a digital-to-analog converter comprised of an R-2R ladder network where all of the resistors of the network are implemented entirely of CMOS transistors. The instant digital-to-analog converter for converting a digital input signal having a plurality of bnary bits into an analog output signal includes a plurality of identical switching cells corresponding to the cells C1, C2, ... Cn forming the ladder network of FIG. 1 which are made up entirely of CMOS transistors and which may be fabricated as part of a single silicon semiconductor chip of a monolithic integrated circuit. Since each of the switching cells of the present invention are of identical design, it will be sufficient to describe one of the switching cells such as cell C2 which is illustrated in detail in FIG. 2 of the drawings.

First, second, and third pairs of CMOS transistors consisting of respective MOS transistors N1 and P2; P5 and N6; and P7 and N8 correspond to the two "R" elements in the leg of the ladder network. Specifically, these three pairs of CMOS transistors form the resistors R12 and R22 of FIG. 1 which are also referred to as cross resistance of the leg. A fourth pair of CMOS transistors consisting of MOS transistors N3 and P4 correspond to the single "R" element connected between the leg and the input to the next succeeding cell. In particular, the fourth pair of CMOS transistors form the resistor R2 of FIG. 1 which is also referred to as a series resistance. For convenience, it will be noted that the P-channel MOS transistors have been identified by the letter P followed by a particular reference numeral, and the N-channel MOS transistors have been identified by the letter N followed by a particular reference numeral.

In the first pair of CMOS transistors, one of the main electrodes such as the drain of the MOS transistor N1 is connected to one of the main electrodes such as the source of th MOS transistor P2. The other main electrode or source of the MOS transistor N1 is connected to the drain of the MOS transistor P2. In the second pair of CMOS transistors, the source of MOS transistor P5 is connected to the drain of the MOS transistor N6, and the drain of the MOS transistor P5 is connected to the source of the MOS transistor N6. Similarly, in the third pair of CMOS transistors the source of the MOS transistor P7 is connected to drain of NMOS transistor N8, and the source of MOS transistor N8 is connected to the drain of MOS transistor P7. Further, in the fourth pair of CMOS transistors the drain of the MOS transistor N3 is connected to the source of MOS transistor P4. The drain of the MOS transistor N3 and the source of MOS transistor P4 are joined to the drain of transistor N1 and the source of transistor P2 defining the ladder node 2 and to an input terminal IREF INPUT for receiving a reference current of a desired magnitude I. The source of transistor N3 and the drain of transistor P4 are joined to an output terminal IREF OUT for delivering a current of a magnitude equal to I/2 to the next succeeding switching cell. The source of transistor N1 and the drain of transistor P2 are joined to the source of transistor P5 and the drain of transistor N6 and to the source of transistor P7 and the drain of the transistor N8.

The control electrodes or gates of the transistors N1 and N3 are connected to a supply voltage VDD which is typically at +5.0 volts for rendering the transistors N1 and N3 to be constantly conductive so as to provide a constant resistance from the respective drains to the respective sources thereof. Likewise, the gates of the transistors P2 and P4 are connected to a supply voltage VSS, which is typically at 0 volts, for rendering the transistors P2 and P4 to be constantly conductive so as to provide a constant resistance from the respective drains to the respective sources thereof.

The drain of the transistor P5 and the source of the transistor N6 are connected to a terminal connectable to the common line IOUT FALSE, and the drain of the transistor P7 and the source of the transistor N8 are connected to a terminal connectable to the common output current summing line IOUT. The line IOUT FALSE has applied thereto a voltage equal to (VDD−VSS)/2 which is, in this instance, equal to +2.5 volts. The line IOUT has applied thereto a voltage equal to (VDD−VSS)/2 by the closed loop operation of operational amplifier 12. The gates of the transistors P5 and N6 are each connected to a respective one of two outputs of a pair of differential driver circuits D1 and D2. The gates of the transistors P7 and N8 are each connected to the respective other one of the two outputs of the differential driver circuits D1 and D2.

The pair of differential driver circuits D1 and D2 define switching means for selectively turning on the second pair of CMOS transistors and turning off the third pair of CMOS or for selectively turning off the second pair and turning on the third pair. The switching means is responsive to a control signal supplied by one of the associated binary bits B1, B2, . . . Bn of the digital input signal. In this case, the binary bit would be B2.

The first differential driver circuit D1 comprises MOS transistors P13, P18, P19, P20, P21, N23, N24, N25 and N26. The transistor P13 has its gate connected to a bias voltage BIAS 1, its source connected to the supply voltages VDD, and its drain connected to the common sources of the transistors P18 through P21. The gates of the transistors P18 and P19 defining a first input are connected to the input binary bit B2. The gates of the transistors P20 and P21 defining a second input are connected to the complement or inverse of the binary bit B2 at the output of the inverter I2. It should be understood that the inverter may be formed by a pair of P-channel and N-channel MOS transistors (not shown) as is conventional in the art.

The drain of the transistor P21 is connected to the drain of the transistor N26 which defines a first output of the differential driver circuit D1. This first output at the common drains of the transistors P21 and N26 is connected to the gate of the transistor P5 in the third pair of CMOS transistors. The gate of the transistor N26 is connected to the gate and drain of the transistor N25 and to the drain of the transistor P19. The drain of the transistor P20 is connected to the gate and drain of the transistor N24 and to the gate of the transistor N23. The drain of the transistor P18 is connected to the drain of the transistor N23 which defines a second output of the differential driver circuit D1. This second output at the common drains of the transistors P18 and N23 is connected to the gate of the transistor P7 of the third pair of CMOS transistors. The sources of the transistors N23 through N26 are connected together and to the supply voltage VSS.

The second differential driver circuit D2 comprises MOS transistors N22, P9, P10, P11, P12, N14, N15, N16 and N17. The transistor N22 has its gate connected to a bias voltage BIAS 2, its source connected to the supply voltage VSS, and its drain connected to the common sources of the transistors N14 through N17. The gates of the transistors N14 and N15 defining a first input are connected to the input binary bit B2. The gates to the transistors N16 and N17 defining a second input are connected to the complement of the binary bit B2 at the output of the inverter I2.

The drain of the transistor N14 is connected to the drain of the transistor P9 which defines a first output of the second differential driver circuit D2. This first output at the common drains of the transistors N14 and P9 is connected to the gate of the transistor N6 in the second pair of CMOS transistors. The gate of transistor P9 is connected to the gate and drain of the transistor P10 and to the drain of the transistor N16. The drain of the transistor N15 is connected to the gate and drain of the transistor P11 and to the gate of the transistor P12. The drain of the transistor N17 is connected to the drain of the transistor P12 which define a second output of the second differential driver circuit D2. This second output at the common drains of the transistors N17 and P12 is connected to the gate of the transistor N8 in the third pair of CMOS transistors. The sources of the transistors P9 through P12 are connected together and to the supply voltage VDD.

It should be understood that the source of the drain designations for all of the P-channel and N-channel transistors operating in "triode" region could be interchanged. In other words, a source electrode could be replaced by a drain electrode. Further, in each of first through fourth pairs of CMOS transistors the drain or source of one of the transistors could be interchanged with the respective drain or source of the other one of the transistors. While the substrate electrodes for all of the transistors have been shown to be "floating", it is preferable to connect the substrate electrode of each P-channel transistor to the supply voltage VDD and to connect the substrate electrode of each N-channel transistor to the supply potential VSS, thereby improving latch-up immunity.

The operation of the switching cell C2 will now be described by assuming initially that the binary bit B2 is at a logic "0" level or state. Since the transistor P13 in the differential driver circuit D1 is turned on, the supply voltage VDD will be applied to the common sources of the transistors P18 through P21. With the binary bit B2 applied to the gates of the transistors P18 and P19 defining the first input and with the complement of the binary bit B2 applied to the gates of the transistors P20 and P21 defining the second input, the transistors P18 and P19 will be turned on and the transistors P20 and P21 will be turned off. As a result, the transistors N25 and N26 will be turned on and the transistors N23 and N24 will be turned off. With the transistor N26 being rendered conductive, the supply voltage VSS will be applied via the first output of the driver circuit D1 to the gate of the transistor P5 causing it to be turned on. Since both the transistors P13 and P18 are turned on, the voltage at the second output the driver circuit D1, which is applied to the gate of the transistor P7, will be two threshold voltage drops of the P-channel transistors above the voltage applied to the source of the transistor P7. In other words, the gate voltage of the transistor P7 will be (VDD−VSS)/2+2(VTp) causing the transistor P7 to be turned off.

Further, since the transistor N22 in the differential driver circuit D2 is turned on the supply voltage VSS will be applied to the common sources of the transistors N14 through N17. With the binary bit B2 also applied to the gates of the transistors N14 and N15 defining the first input of the driver circuit D2 and with the complement of the binary bit B2 also applied to the gates of the transistors N16 and N17 defining the second input of the driver circuit D2, the transistors N14 and N15 will be turned off and the transistors N16 and N17 will be turned on. As a result, the transistors P9 and P10 will be turned on and the transistors P11 and P12 will be turned off. With the transistor P9 being rendered conductive, the supply voltage VDD will be applied, via the first output of the driver circuit D2, to the gate of the transistor N6 causing it to be turned on. Since both the transistors N22 and N17 are turned on, the voltage at the second output of the driver circuit D2, which is applied to the gates of the transistor N8, will be two threshold voltage drops of the N-channel transistors below the voltage applied to the source of the transistor N8. In other words, the gate voltage of the transistor N8 will be (VDD−VSS)/2−2(VTn) causing the transistor N8 to be turned off.

In this operating condition, the second pair of CMOS transistors will be rendered conductive whereas the third pair of CMOS transistors will be turned off. The terminal voltages first pair and fourth pair of CMOS transistors are identical. The terminal voltages on the second transistor pair will match the voltage drop across the entire succeeding cell(s) of the digital-to-analog converter. With the proper adjustment of ratio of W/L (width to length) for each pair of CMOS transistors, each paired drain-to-source resistance will be relatively constant for all values of drain-to-source voltage, channel current and source-to-substrate voltage, thereby minimizing the voltage coefficient of resistance. Therefore, the reference current "I" entering the terminal IREF INPUT will divide equally at the ladder node 2, i.e., the current magnitude of I/2 will be delivered to the ground line IOUT FALSE and to the terminal IREF OUT for the next succeeding cell.

Under the opposite operating condition where the binary bit B2 is assumed to be at a logic "1" level or state, the first output of the driver circuit D1 and the first output of the driver circuit D2 will cause the respective transistors P5 and N6 of the second transistor pair to be rendered non-conductive. Further, the second output of the driver circuit D1 and the second output of the driver circuit D2 will cause the respective transistors P7 and N8 of the third transistor pair to be turned on. As a result, the current magnitude of I/2 will be delivered to the output current summing line IOUT and to the terminal IREF OUT for the next succeeding cell.

When a positive sign of the reference current +IREF is applied to the present R-2R ladder network composed of CMOS transistors, the P-channel transistors will conduct more current than the N-channel transistors due to the fact that they are forced further into the "triode" operating region. Thus, the drain-to-source resistance of the P-channel transistors will be lower than the drain-to-source resistance of the N-channel transistors. On the other hand, if a negative sign of reference current −IREF, i.e., the sign bit B0 is changed, is applied to the ladder network, the N-channel transistors will then conduct more current than the P-channel transistors since the N-channel transistors will be forced further into "triode" operating region. Consequently, the drain-to-source resistance of the N-channel transistors will be lower than the drain-to-source resistance of P-channel transistors. In order to maintain the desired resistance characteristics from one direction of the reference input current to the opposite current direction, the ratio of the W/L of the P-channel transistors is adjusted to the W/L of the N-channel transistors so as to produce a ratio of P-channel drain-source current to N-channel drain-source current of N:1 for one reference current direction and a ratio of 1:N for the opposite reference current direction.

Figure 3A:
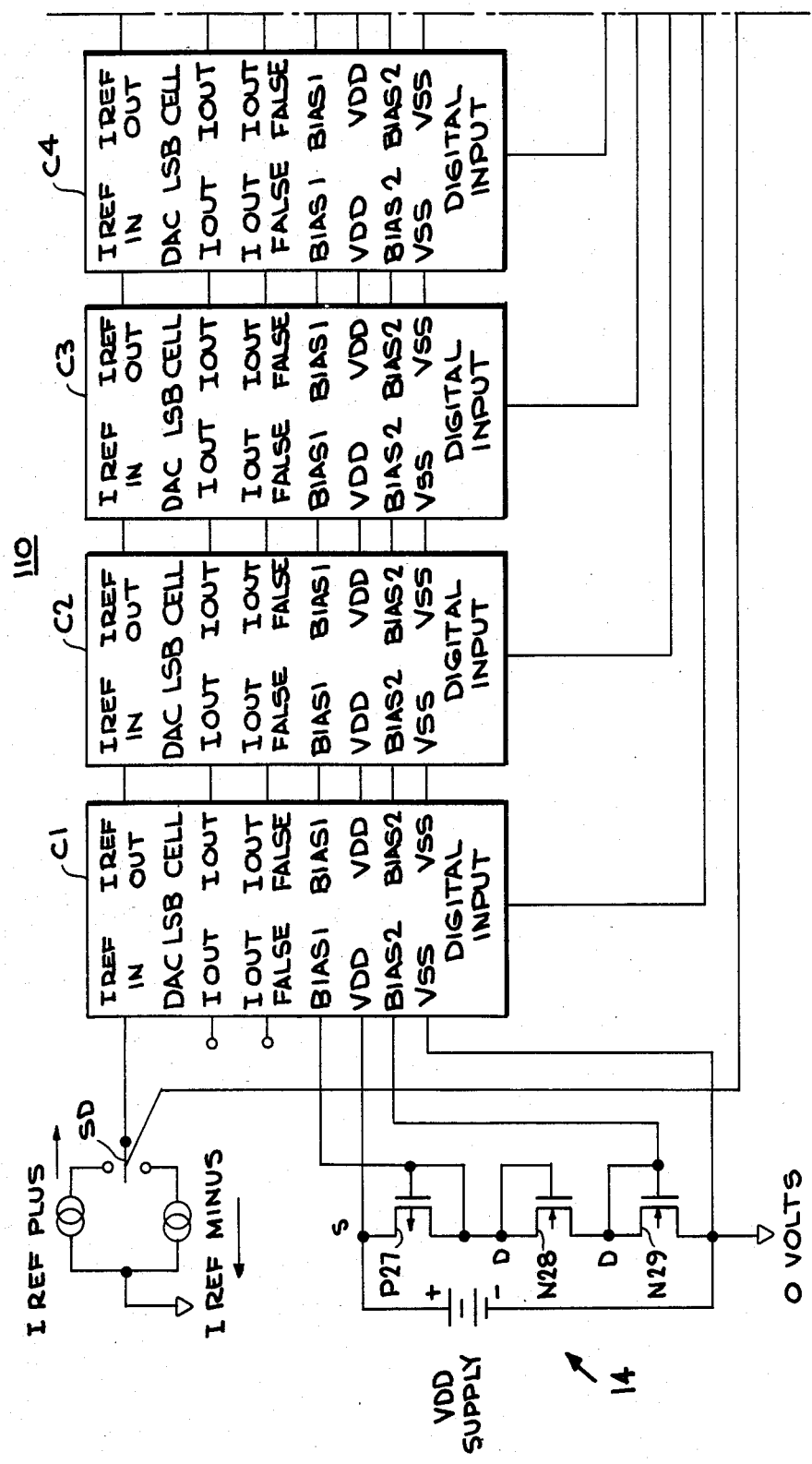
FIG. 3 is a schematic diagram, partly in block form, illustrating the overall arrangement of the digital-to-analog converter constructed in accordance with the principles of the present invention.
Figure 3B:
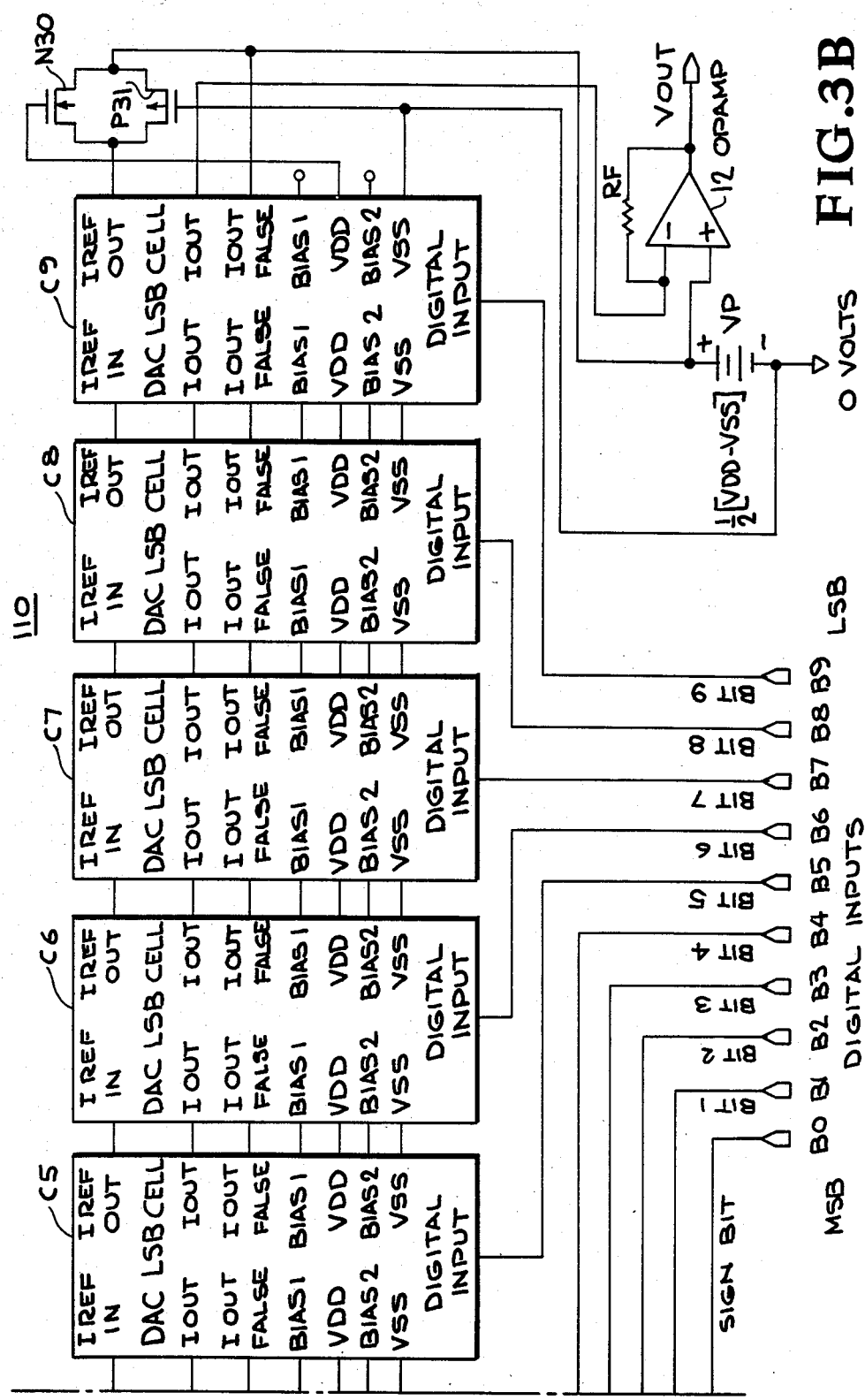

The overall digital-to-analog converter of the present invention is depicted, partly in block form, in FIG. 3. As can be seen, the digital-to-analog converter has nine identical switching cells C1, C2, . . . C9 which are responsive to their respective binary bits B1, B2, . . . B9. The nine cells are concatenated with the cell C1 being the MSB and the cell C9 being the LSB. At the MSB end, either a positive reference current +IREF or a negative reference current −IREF is supplied dependent on the position of the switch S0 as controlled by the sign bit B0.

At the LSB end, another pair of CMOS transistors N30 and P31 are connected to the last cell C9 so as to ensure that the reference current will divide equally at every ladder node down to the last one. The transistors N30 and P31 correspond to the single resistor R shown in FIG. 1. The drain of transistor N30 and the source of transistor P31 are connected together and to the output of the last cell C9 at the terminal IREF OUT. The source of transistor N30 and the drain of transistor P31 are also connected together and to the ground potential via a supply potential VP which is equal to (VDD−VSS)/2. The gate of the transistor N30 is connected to the supply voltage VDD and the gate of the transistor P31 is connected to the supply voltage VSS, thereby causing both transistors N30 and P31 to be constantly conductive. The output current summing line IOUT connected to each of the switching cells is fed to the inverting input of the operational amplifier 12. The non-inverting input of the operational amplifier 12 is connected to the ground line IOUT FALSE and to the ground potential via the supply potential VP. Each of the switching cells C1, C2, . . . C9 is operated in response to the respective binary bits B1, B2, . . . B9. Depending upon the state of the binary bits, the reference current flowing through the respective leg in each cell is switched between the summing line IOUT and the ground line IOUT FALSE. The reference current in the summing line IOUT is fed through a resistor RF to provide the voltage VOUT at the output of the operational amplifier 12 representing the analog output of the converter.

While nine cells have been shown, it should be clearly understood that the digital-to-analog converter may be formed of any number of switching cells as desired by adding or subtracting cells. Even though an infinite number of cells is theoretically possible, the actual number is controlled by the physical limitations of the operational amplifier 12.

A bias generator network 14 is provided for all of the switching cells so as to limit the swing of the gate voltages applied on the transistors in the second and third pairs for turning them off. The bias generator 14 includes P27, N28 and N29. The source of the transistor P27 is connected to the supply voltage VDD. The gate and drain of the transistor P27 are connected together and to the drain and gate of the transistor N28. The gate of the transistor P27 provides the first bias voltage BIAS 1 to the switching cells. The source of the transistor N28 is connected to the drain and gate of transistor N29 which supplies the second bias voltage BIAS 2 to the switching cells. The source of the transistor N29 is connected to the ground potential. By selecting the appropriate width and length dimensions for the transistors P27, N28 and N29, the transistors P5 and P7 are made to turn off when their gate reach a voltage equal to $(VDD-VSS)/2+2$ (VTp) and the transistors N6 and N7 are made to turn off when their gates reach a voltage equal to $(VDD-VSS)/2-2(VTn)$.

From the foregoing detailed description, it can thus be seen that the present invention provides an improved digital-to-analog converter having an R-2R ladder network composed entirely of CMOS transistors. Further, the ladder network forms a plurality of switching cells wherein each cell is formed of first, second, and third pairs of CMOS transistors defining cross resistances of the ladder network and of a fourth pair of CMOS transistors defining a series resistance of the ladder network.

While there has been illustrated and described that is at present to be considered a preferred embodiment of the present invention, it will be understood by those skilled in the art that various changes and modifications may be made, and equivalents may be substituted for elements thereof without departing from the central scope of the invention. In addition, many modifications may be made to adapt a particular situation to the teachings of the invention without departing from the central of thereof. Therefore, it is intended that this invention not be limited to the particular embodiment disclosed as the best mode contemplated for carrying out this invention, but that the invention will include all embodiments falling within the scope of the appended claims.

What is claimed is:

1. A digital-to-analog converter for converting a digital signal having a plurality of binary bits into an analog output signal comprising:
   an R-2R ladder network forming a plurality of switching cells corresponding in number to the number of said binary bits;
   each switching cell being formed of first, second, and third pairs of CMOS transistors defining cross resistances of the ladder network and of a fourth pair of CMOS transistors defining a series resistance of the ladder network, each of first through fourth pairs including a P-channel MOS transistor and an N-channel MOS transistor having the drain of the NMOS transistor connected to the source of the PMOS transistor and the source of the NMOS transistor connected to the drain of the PMOS transistor;
   the NMOS drain and PMOS source of said first pair being connected to the NMOS drain and PMOS source of said fourth pair to define a ladder node, the NMOS source and PMOS drain of said first pair being connected to the NMOS drain and PMOS source of said second pair and to the NMOS drain and PMOS source of said third pair, the NMOS source and PMOS drain of said second pair being coupled to a common line and the NMOS source and PMOS drain of said third pair being coupled to a common output current summing line, the NMOS source and PMOS drain of said fourth pair being connected to a next ladder node of a succeeding switching cell;
   the gates of said P-channel transistors in said first and fourth pairs being connected to a first supply voltage for rendering them to be constantly conductive and the gates of said N-channel transistors in said first and fourth pairs being connected to a second supply voltage for rendering them to be constantly conductive; and
   switching means having inputs responsive to a respective binary bit of said digital signal and having outputs connected to the gates of the P-channel and N-channel transistors in said second and third pairs for selectively turning on or off said second pair and turning off or on said third pair respectively dependent upon the logic state of said respective binary bit.

2. A digital-to-analog converter as claimed in claim 1, wherein said switching means comprises first and second differential driver circuits, each of said first and second differential driver circuits having a first input responsive to said respective binary bit and a second input responsive to the complement of said respective binary bit.

3. A digital-to-analog converter as claimed in claim 2, wherein said first differential driver circuit has a first output connected to the gate of the P-channel transistor in said second pair and a second output connected to the gate of the P-channel in said third pair.

4. A digital-to-analog converter as claimed in claim 3, wherein said second differential driver circuit has a first output connected to the gate of the N-channel transistor in said second pair and a second output connected to the gate of the N-channel transistor in said third pair.

5. A digital-to-analog converter as claimed in claim 3, wherein said first differential driver circuit is formed of P-channel and N-channel MOS transistors.

6. A digital-to-analog converter as claimed in claim 4, wherein said second differential driver circuit is formed of P-channel and N-channel MOS transistors.

7. A digital-to-analog converter as claimed in claim 1, wherein said converter is formed as part of single silicon semiconductor chip of a monolithic integrated circuit.

8. A digital-to-analog converter as claimed in claim 2, further comprising a bias generator network for supplying a first bias voltage to said first differential driver circuit and a second bias voltage to said second differential driver circuit.

9. A digital-to-analog converter as claimed in claim 8, wherein said bias network comprises a P-channel MOS transistor, a first N-channel MOS transistor and a second N-channel MOS transistor.

10. A digital-to-analog converter as claimed in claim 9, wherein said P-channel transistor has its source connected to said first supply voltage and its gate and drain connected together, said first N-channel transistor having its gate and drain connected together and to the drain of said P-channel transistor, said second N-channel transistor having its gate and drain connected together and its source connected to a ground potential, the common drains of said P-channel transistor and said first N-channel transistor defining said first bias voltage, the common drain and gate of said second N-channel transistor defining said second voltage.

11. In a digital-to-analog converter for converting a digital signal having a plurality of binary bits into an analog output signal, the improvement comprising:

an R-2R ladder network forming a plurality of switching cells corresponding in number to the number of said binary bits;

each switching cell being formed of first, second and third pairs of CMOS transistors defining cross resistances of the ladder network and of a fourth pair of CMOS transistors defining a series resistance of the ladder network, each of said first through fourth pairs including a P-channel MOS transistor and an N-channel MOS transistor having the drain of the NMOS transistor connected to the source of the PMOS transistor and the source of the NMOS transistor connected to the drain of the PMOS transistor;

the NMOS drain and PMOS source of said first pair being connected to the NMOS drain and PMOS source of said fourth pair to define a ladder node, the NMOS source and PMOS drain of said first pair being connected to the NMOS drain and PMOS source of said second pair and to the NMOS drain and PMOS source of said third pair, the NMOS source and PMOS drain of said second pair being coupled to a common line and the NMOS source and PMOS drain of said third pair being coupled to a common output current summing line, the NMOS source and PMOS drain of said fourth pair being connected to a next ladder node of a succeeding switching cell; and the gates of said P-channel transistors in said first and fourth pairs being connected to a first supply voltage for rendering them to be constantly conductive and the gates of said N-channel transistors in said first and fourth pairs being connected to a second supply voltage for rendering them to be constantly conductive.

12. In a digital-to-analog converter as claimed in claim 11, further comprising switching means having inputs responsive to a respective binary bit of said digital signal and having outputs connected to the gates of the P-channel and N-channel transistors in said second and third pairs for selectively turning on or off said second pair and turning off or on said third pair dependent upon the logic of said respective binary bit.

13. In a digital-to-analog converter as claimed in claim 12, wherein said switching means comprises first and second differential driver circuits, each of said first and second differential driver circuits having a first input responsive to said respective binary bit and a second input responsive to the complement of said respective binary bit.

14. In a digital-to-analog converter as claimed in claim 13, wherein said first differential driver circuit has a first output connected to the gate of the P-channel transistor in said second pair and a second output connected to the gate of the P-channel in said third pair.

15. In a digital-to-analog converter as claimed in claim 14, wherein said second differential driver circuit has a first output connected to the gate of the N-channel transistor in said second pair and a second output connected to the gate of the N-channel transistor in said third pair.

16. In a digital-to-analog converter as claimed in claim 15, wherein said first differential driver circuit is formed of P-channel and N-channel MOS transistors.

17. In a digital-to-analog converter as claimed in claim 16, wherein said second differential driver circuit is formed of P-channel and N-channel MOS transistors.

18. In a digital-to-analog converter as claimed in claim 12, wherein said converter is formed as part of single silicon semiconductor chip of a monolithic integrated circuit.

19. In a digital-to-analog converter as claimed in claim 13, further comprising a bias generator network for supplying a first bias voltage to said first differential driver circuit and a second bias voltage to said second differential driver circuit.

20. In a digital-to-analog converter as claimed in claim 19, wherein said bias network comprises a P-channel MOS transistor, a first N-channel MOS transistor and a second N-channel MOS transistor.

* * * * *